(12) United States Patent
Doi

(10) Patent No.: US 7,203,611 B2
(45) Date of Patent: Apr. 10, 2007

(54) TIMING GENERATOR, TEST APPARATUS AND SKEW ADJUSTING METHOD

(75) Inventor: Masaru Doi, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/197,118

(22) Filed: Aug. 4, 2005

(65) Prior Publication Data

US 2006/0041772 A1 Feb. 23, 2006

(30) Foreign Application Priority Data

Aug. 12, 2004 (JP) ............... 2004-235635

(51) Int. Cl.
*G01R 13/00* (2006.01)
*G01R 29/02* (2006.01)
*G06F 1/04* (2006.01)

(52) U.S. Cl. .................. 702/69; 702/79; 713/503

(58) Field of Classification Search .............. 702/69, 702/72, 79, 89, 117, 118, 119, 125, 124, 126, 702/189; 714/718, 733; 365/201, 233; 713/500, 713/503

See application file for complete search history.

(56) References Cited

U.S. PATENT DOCUMENTS

| 5,280,195 | A * | 1/1994 | Goto et al. ............. 327/294 |
| 6,324,142 | B1 * | 11/2001 | Ishitoya et al. ........ 369/59.23 |
| 6,574,579 | B1 * | 6/2003 | Watanabe ............. 702/124 |

* cited by examiner

*Primary Examiner*—Bryan Bui
(74) *Attorney, Agent, or Firm*—Osha• Liang LLP

(57) ABSTRACT

There is provided a timing generator generating a timing signal of a predetermined period. The timing generator includes a set/reset latch, a set unit supplying the set signal, and a reset unit supplying the reset signal, in which the set unit includes: a first variable delay circuit that delays a given reference clock to output a first set signal; a second variable delay circuit that delays the given reference clock to output a second set signal having a phase different from the first set signal; an OR circuit that computes a logical sum of the first set signal and the second set signal to generate the set signal; and a third variable delay circuit that delays the set signal output from the OR circuit to adjust a skew between the set signal and the reset signal.

9 Claims, 8 Drawing Sheets

LINEARIZED MEMORY 32

| ADDRESS | CONTROL DATA |
|---|---|
| ⋮ | ⋮ |
| #4 (40PS) | #19 |
| #3 (30PS) | #15 |
| #2 (20PS) | #9 |
| #1 (10PS) | #4 |
| #0 (0PS) | #0 |

*FIG. 4*

THE SECOND LINEARIZED MEMORY 32-2

| ADDRESS | CONTROL DATA |
|---|---|
| ⋮ | ⋮ |
| #4 (40PS) | #49 |
| #3 (30PS) | #44 |
| #2 (20PS) | #41 |
| #1 (10PS) | #35 |
| #0 (0PS) | #30 |

*FIG. 6*

TIMING GENERATOR, TEST APPARATUS AND SKEW ADJUSTING METHOD

CROSS REFERENCE TO THE RELATED APPLICATION

The present application claims priority from a Japanese Patent Application No. 2004-235635 filed on Aug. 12, 2004, the contents of which are incorporated herein by reference.

BACKGROUND OF THE INVENTION

1. Field of the Invention

The present invention relates to a timing generator for generating a timing signal of a predetermined period, a testing device testing an electronic device, and a skew adjusting method adjusting a skew between interleaved signals in a timing generator using an interleaving method.

2. Description of Related Art

Conventionally, there is known a circuit that generates a set signal and a reset signal of a desired phase and inputs the signals to a set/reset latch to generate a desired pattern. Such a circuit is used in a timing generator that generates a timing signal for a device such as a semiconductor testing device, and generates a timing signal of a desired pattern.

Such a timing generator includes a plurality of set/reset latches to generate a plurality of timing signals at the same time, in order to test a plurality of devices under test and a plurality of pins of the device under test at the same time. Moreover, it is necessary to divide a set signal of a desired phase into a plurality of signals and a reset signal of a desired phase into a plurality of signals corresponding to the plurality of set/reset latches.

FIG. 8 is a view showing a conventional timing generator 400. As described above, the timing generator 400 includes a plurality of set/reset latches 410, a set circuit 420, and a reset circuit 430. Since the set circuit 420 and the reset circuit 430 have the same configuration, it will be described about a configuration of the set circuit 420.

The set circuit 420 includes a variable delay circuit for phase control 440 for controlling a phase of a set signal in accordance with a desired phase and a plurality of variable delay circuits for skew adjustment 450 for adjusting a skew between the divided set signals in order to supply the signals to the plurality of set/reset latches 410. For example, when generating four timing signals, the four set/reset latches 410 and the four variable delay circuits for skew adjustment 450 are required, and thus the set signal is divided into four signals.

Moreover, the set circuit 420 generates a set signal based on a reference clock of a semiconductor testing device. However, since the frequency of reference clock is constant, the set circuit 420 interleaves the reference clock to generate the set signal when generating a timing signal of a higher frequency. As shown in FIG. 8, when performing two-way interleaving, the set circuit 420 has two variable delay circuits for phase control 440. Thus, the set circuit 420 generates the first set signal and the second set signal that are controlled respectively to have a desired phase, in which the phases are different from each other by half cycle.

Moreover, in this case, the eight variable delay circuits for skew adjustment 450 are required to respectively divide the first set signal and the second set signal into four signals. Then, OR circuits 460 respectively generate a logical sum of the first set signal and the second set signal to supply the logical sum to the set/reset latch 410 as the set signal. In this case, the variable delay circuits for skew adjustment 450 adjust a skew between the first set signal and the second set signal in addition to a skew between the timing signals.

However, in a case where the conventional timing generator 400 generates the set signal and the reset signal by the interleaving method as described above, a plurality of variable delay circuits for skew adjustment 450 is required. For this reason, there has been a problem that the power consumption of the timing generator 400 increases. Particularly, since it is required that a variable delay circuit for adjusting a skew generate a highly precise delay, there are required a circuit and a control for reducing a variation in a delay amount by the change of working factor, thereby increasing the power consumption.

SUMMARY OF THE INVENTION

Therefore, it is an object of the present invention to provide a timing generator, a testing device, and a skew adjusting method that can solve the foregoing problems. The above and other objects can be achieved by combinations described in the independent claims. The dependent claims define further advantageous and exemplary combinations of the present invention.

To solve this problem, according to the first aspect of the present invention, there is provided a timing generator generating a timing signal of a predetermined period. The timing generator includes: a set/reset latch operable to generate a rising edge of the timing signal according to a given set signal and generate a trailing edge of the timing signal according to a given reset signal; a set unit operable to supply the set signal to the set/reset latch; and a reset unit operable to supply the reset signal to the set/reset latch, in which the set unit includes: a first variable delay circuit that delays a given reference clock to output a first set signal; a second variable delay circuit that delays the given reference clock to output a second set signal having a phase different from the first set signal; an OR circuit that computes a logical sum of the first set signal and the second set signal to generate the set signal; and a third variable delay circuit that delays the set signal output from the OR circuit to adjust a skew between the set signal and the reset signal.

The timing generator may further include a skew adjusting unit operable to measure a skew between the first set signal and the second set signal and control a delay amount in the first variable delay circuit or the second variable delay circuit based on the measured skew.

The timing generator may further include: a signal input unit operable to receive the reference clock, stop inputting the reference clock to the second variable delay circuit when measuring the timing in which the first variable delay circuit outputs the first set signal, and stop inputting the reference clock to the first variable delay circuit when measuring the timing in which the second variable delay circuit outputs the second set signal; and a loop path operable to input the set signal output from the OR circuit to the signal input unit by feedback as the reference clock, and the skew adjusting unit may measure a skew between the first set signal and the second set signal based on a difference between a loop period for which the set signal passes the loop path when measuring the timing in which the first variable delay circuit outputs the first set signal and a loop period for which the set signal passes the loop path when measuring the timing in which the second variable delay circuit outputs the second set signal.

The timing generator may further includes: a first linearized memory operable to store control data controlling the first variable delay circuit according to a given delay setting value in association with the each delay setting value; and a second linearized memory operable to store control data controlling the second variable delay circuit according to a given delay setting value in association with the each delay setting value, and the skew adjusting unit may adjust the control data stored on the first linearized memory and the second linearized memory based on the measured skew.

The skew adjusting unit may measure a skew between the first set signal and the second set signal when setting the delay setting values related to the first variable delay circuit and the second variable delay circuit to a minimum delay setting value, and adjust the control data stored on the first linearized memory and the second linearized memory based on the measured skew.

The skew adjusting unit may detect which of the phases of the signals output from the first variable delay circuit and the second variable delay circuit is early, and store the control data to be stored in association with a setting value, which is obtained by adding a value according to the measured skew to the each delay setting value, on the first linearized memory or the second linearized memory corresponding to the first variable delay circuit or the second variable delay circuit that outputs the signal having the early phase, in association with the each delay setting value.

The timing generator may further includes: a skew register operable to store a quotient that is obtained by dividing the skew measured by the skew adjusting unit by resolution of the delay setting values of the first variable delay circuit and the second variable delay circuit; and an addition unit operable to add the value stored on the skew register to the delay setting value to be supplied to the first variable delay circuit or the second variable delay circuit that supplies the signal having the early phase, and the skew adjusting unit may store the control data to be stored in association with a setting value, which is obtained by adding a remainder obtained by dividing the measured skew by resolution of the delay setting values of the first variable delay circuit and the second variable delay circuit to the each delay setting value, on the first linearized memory or the second linearized memory corresponding to the first variable delay circuit or the second variable delay circuit that outputs the signal having the early phase, in association with the each delay setting value.

The timing generator may further include an exclusive OR circuit provided on the loop path, and operable to select either whether there are output the first set signal and the second set signal by noninversion or whether there are output the first set signal and the second set signal by inversion according to an edge control signal showing which of a leading edge and a trailing edge of the first set signal and the second set signal the skew is measured based on.

According to the second aspect of the present invention, there is provided a testing device testing an electronic device. The testing device includes: a pattern generator operable to generate a test pattern for testing the electronic device; a timing generator operable to generate a timing signal of a desired period; a waveform shaper operable to generate a test signal to be input to the electronic device based on the test pattern and the timing signal; and a judgment section operable to evaluate and determine whether the good or bad quality of the electronic device based on an output signal output from the electronic device, in which the timing generator includes: a set/reset latch that generates a rising edge of the timing signal according to a given set signal and generates a trailing edge of the timing signal according to a given reset signal; a set unit that supplies the set signal to the set/reset latch; and a reset unit that supplies the reset signal to the set/reset latch, and the set unit includes: a first variable delay circuit that delays a given reference clock to output a first set signal; a second variable delay circuit that delays the given reference clock to output a second set signal having a phase different from the first set signal; an OR circuit that computes a logical sum of the first set signal and the second set signal to generate the set signal; and a third variable delay circuit that delays the set signal output from the OR circuit to adjust a skew between the set signal and the reset signal.

According to the third aspect of the present invention, there is provided a skew adjusting method adjusting a skew between a first signal and a second signal in a timing generator that includes: a first variable delay circuit that outputs the first signal; a second variable delay circuit that outputs the second signal; a first linearized memory that stores control data controlling the first variable delay circuit according to a given delay setting value in association with the each delay setting value; a second linearized memory that stores control data controlling the second variable delay circuit according to a given delay setting value in association with the each delay setting value; and an OR circuit that outputs a logical sum of the first signal and the second signal. The skew adjusting method includes: a first period computing step of inputting the first signal to the first variable delay circuit via the OR circuit by feedback and computing a period by which the OR circuit outputs the first signal; a second period computing step of inputting the second signal to the second variable delay circuit via the OR circuit by feedback and computing a period by which the OR circuit outputs the second signal; a skew measuring step of computing a skew between the first signal and the second signal based on the difference between the period computed in the first period computing step and the period computed in the second period computing step; and a skew adjusting step of storing the control data to be stored in association with a setting value, which is obtained by adding a value according to the skew measured in the skew measuring step to the each delay setting value, on either the first linearized memory or the second linearized memory, in association with that delay setting value.

The summary of the invention does not necessarily describe all necessary features of the present invention. The present invention may also be a sub-combination of the features described above.

BRIEF DESCRIPTION OF THE DRAWINGS

FIG. 4 is a view exemplary showing data stored on a linearized memory.

FIG. 6 is a view exemplary showing data stored on the second linearized memory.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
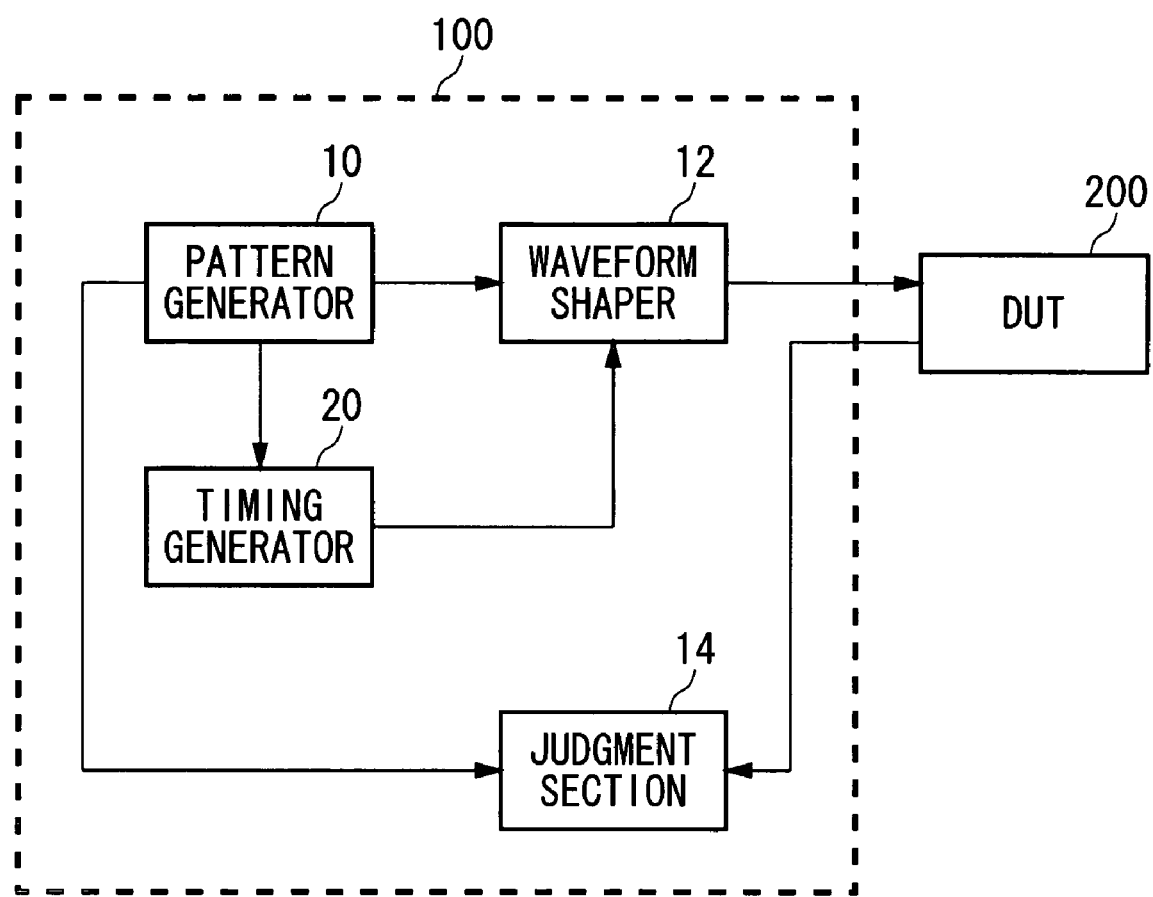
FIG. 1 is a view exemplary showing a configuration of a testing device according to an embodiment of the present invention.

FIG. 1 is a view exemplary showing a configuration of a testing device 100 according to an embodiment of the present invention. The testing device 100 is a device that tests an electronic device 200 having a circuit such as a semiconductor circuit, and includes a pattern generator 10, a waveform shaper 12, a timing generator 20, and a judgment section 14.

The pattern generator 10 generates a test pattern for testing the electronic device 200. The test pattern is the combination of one or zero defined by, e.g., a test program that is previously provided in order to test the electronic device 200. The timing generator 20 generates a timing signal of a desired period. The pattern generator 10 controls a period of the timing signal generated from the timing generator 20 based on the test program.

The waveform shaper 12 generates a test signal to be input to the electronic device 200 based on the test pattern and the timing signal. For example, the waveform shaper 12 outputs a voltage according to the value of the test pattern in the timing by the timing signal to shape a waveform of the test signal.

The judgment section 14 evaluates and judges whether the good or bad quality of the electronic device 200 based on the output signal output from the electronic device 200 according to a given test signal. For example, the judgment section 14 is supplied with an expected value signal according to the test pattern generated from the pattern generator 10, and judges the good or bad of the electronic device 200 by comparing the expected value signal and the output signal.

Moreover, when testing a plurality of electronic devices 200 and a plurality of pins of the electronic device 200 at the same time, the pattern generator 10 generates a plurality of test patterns, the timing generator 20 generates a plurality of timing signals, and the waveform shaper 12 generates the test signals to be input to each of the electronic devices 200 and the pins thereof based on the corresponding test patterns and timing signals.

Figure 2:
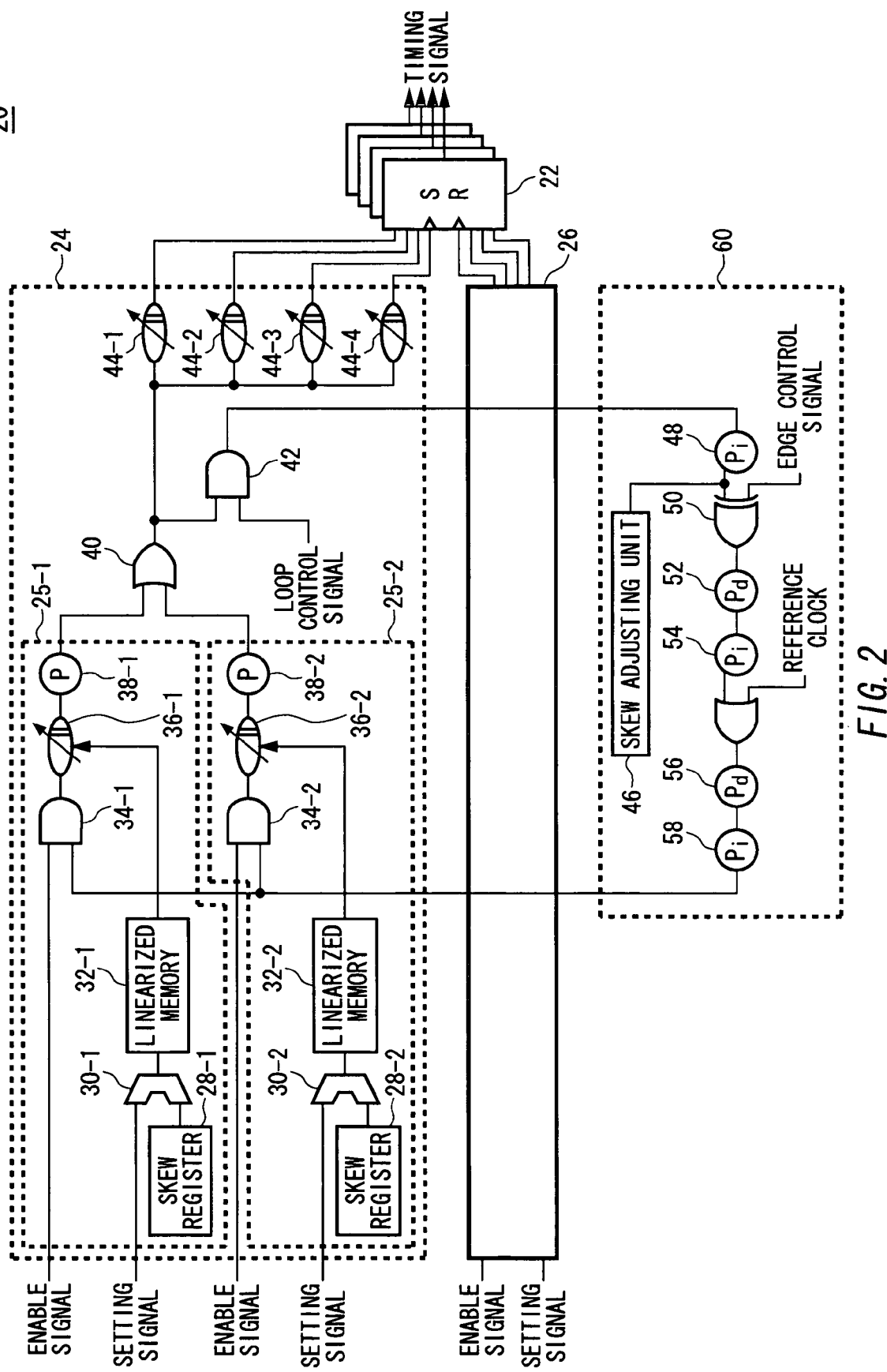
FIG. 2 is a view exemplary showing a configuration of a timing generator 20.

FIG. 2 is a view exemplary showing a configuration of the timing generator 20. The timing generator 20 includes a plurality of set/reset latches 22, a set unit 24, a reset unit 26, and a loop path 60. The timing generator 20 has a normal operation mode generating a timing signal of a desired period and an adjustment operation mode adjusting a skew. At first, it will be described about when the timing generator 20 operates in a normal operation mode.

Each set/reset latch 22 is provided corresponding to the plurality of electronic devices 200 to be tested or the plurality of pins of the electronic device 200, and generates a rising edge of the timing signal according to the supplied set signal and generates a trailing edge of the timing signal according to the supplied reset signal.

The set unit 24 supplies a set signal to each of the set/reset latches 22. Moreover, the reset unit 26 supplies a reset signal to each of the set/reset latches 22. In this example, a configuration of the set unit 24 will be explained. However, the reset unit 26 has a similar configuration to that of the set unit 24.

The set unit 24 has a first interleaving circuit 25-1, a second interleaving circuit 25-2, an OR circuit 40, an AND circuit 42, and a plurality of third variable delay circuits 44-1 to 44-4 (hereinafter generally referred to as 44).

The first interleaving circuit 25-1 and the second interleaving circuit 25-2 are supplied with a reference clock of the testing device 100 via the loop path 60, and output the first set signal and the second set signal based on the reference clock.

The first interleaving circuit 25-1 has a first skew register 28-1, a first adder 30-1, a first linearized memory 32-1, a first AND circuit 34-1, a first variable delay circuit 36-1, and a first pulser 38-1, and the second interleaving circuit 25-2 has a second skew register 28-2, a second adder 30-2, a second linearized memory 32-2, a second AND circuit 34-2, a second variable delay circuit 36-2, and a second pulser 38-2.

The first AND circuit 34-1 and the second AND circuit 34-2 output a logical sum of an enable signal generated from the pattern generator 10 according to the test program and the reference clock. When the timing generator 20 operates in a normal operation mode or in an adjustment operation mode, the pattern generator 10 supplies an enable signal of the H logic to the timing generator 20 and causes each of the AND circuits to output the reference clock. In other words, the first AND circuit 34-1 and the second AND circuit 34-2 function as a signal input unit that controls whether the reference clock is input to the first variable delay circuit 36-1 and the second variable delay circuit 36-2.

The first variable delay circuit 36-1 delays a given reference clock and outputs the first set signal. A delay amount in the first variable delay circuit 36-1 is controlled by a setting signal generated from the pattern generator 10 according to the test program. The second variable delay circuit 36-2 delays a given reference clock and outputs the second set signal having a phase different from that of the first set signal. A delay amount in the second variable delay circuit 36-2 is also controlled by the described setting signal. Moreover, the phase of the first set signal and the phase of the second set signal are respectively controlled at a desired phase, e.g., in a phase deviated from the reference clock by about half cycle. The first variable delay circuit 36-1 and the second variable delay circuit 36-2 are circuits having the generally same characteristics, and the setting signal is a delay setting value showing a delay amount caused by each of the variable delay circuits.

Moreover, the first pulser 38-1 and the second pulser 38-2 adjust pulse widths of the first set signal and the second set signal to a predetermined pulse width to output the result. The OR circuit 40 computes a logical sum of the first set signal and the second set signal to generate the set signal. By such a configuration, it is possible to generate a set signal having a frequency of about two times of the reference clock. Moreover, in this example, the set signal is generated by a two-way interleaving method. However, the set signal may be generated by an n-way interleaving method more than two-way.

The set signal generated from the OR circuit 40 is separated and then input to set terminals of the set/reset latches 22 respectively. The third variable delay circuit 44 is provided between an output terminal of the OR circuit 40 and each of the set terminals of the set/reset latches 22. The third variable delay circuit 44 delays the set signal output from the OR circuit 40, and adjusts a skew between the set signal and the reset signal and a skew between a plurality of set signals input to the plurality of set/reset latches 22. These skews are measured previously, and a delay amount of each of the third variable delay circuits 44 is previously set based on these skews.

According to the timing generator 20 of this example, since the skew is adjusted in the latter part of the OR circuit 40, it is possible to reduce the number of the third variable delay circuits 44 for adjusting the skew compared to the conventional timing generator 400. For this reason, it is possible to reduce power consumption and also circuit scale.

However, by the operation, a skew between the first set signal and the second set signal can not be adjusted. Although a skew more than delay setting resolution of the first variable delay circuit 36-1 and the second variable delay circuit 36-2 can be adjusted by controlling a delay amount in the first variable delay circuit 36-1 and the second variable delay circuit 36-2, a skew smaller than the delay setting resolution remains behind. When testing a high-speed semiconductor circuit, since such a skew is not permitted, it is necessary to adjust the skew with high precision. Next, in an adjustment operation mode, a method adjusting a skew between the first set signal and the second set signal will be described.

When measuring a skew between the first set signal and the second set signal, at first an enable signal of the H logic is supplied to the first AND circuit 34-1 and an enable signal of the L logic is supplied to the second AND circuit 34-2. In this way, the timing in which the first variable delay circuit 36-1 outputs the first set signal is measured. In other words, the input of the reference clock to the second variable delay circuit 36-2 is stopped, and the first set signal is output to the OR circuit 40.

The AND circuit 42 outputs the logical product of a set signal output from the OR circuit 40 and a loop control signal supplied from the pattern generator 10. When the timing generator 20 operates in an adjustment operation mode, the pattern generator 10 supplies the loop control signal of the H logic to the AND circuit 42 and inputs the set signal to the loop path 60.

The loop path 60 inputs the received set signal to each of the first AND circuit 34-1 and the second AND circuit 34-2 as a new reference clock by feedback. As described above, since the enable signal of the L logic is input to the second AND circuit 34-2, the path of the only first set signal is looped via the OR circuit 40, the AND circuit 42, and the loop path 60. The skew adjusting unit 46 measures the loop period for which the first set signal passes the loop path 60.

Next, the enable signal of the L logic is supplied to the first AND circuit 34-1 and the enable signal of the H logic is supplied to the second AND circuit 34-2. In this way, the timing in which the second variable delay circuit 36-2 outputs the second set signal is measured. In other words, the input of the reference clock to the first variable delay circuit 36-1 is stopped, and the second set signal is output to the OR circuit 40. In this way, after setting the enable signal, the loop period for which the second set signal passes the loop path 60 is measured similarly to the first set signal. Then, the skew adjusting unit 46 computes a skew between the first set signal and the second set signal by means of the difference between the loop period of the first set signal and the loop period of the second set signal.

The skew adjusting unit 46 controls the delay amount in the first variable delay circuit 36-1 or the second variable delay circuit 36-2 based on the measured skew to adjust the skew. The delay amount of the first variable delay circuit 36-1 and the second variable delay circuit 36-2 is controlled by the first linearized memory 32-1 and the second linearized memory 32-2 that stores control data for controlling each variable delay circuit according to given delay setting values in association with each delay setting value.

The skew can be reduced with limits of resolution of the delay setting value by controlling the delay setting value to be supplied to the linearized memory 32 according to the measured skew. However, the skew adjusting unit 46 of this example reduces the skew up to the size of less than or equal to resolution of the delay setting value by adjusting control data stored on the first linearized memory 32-1 and the second linearized memory 32-2 based on the measured skew.

Figure 3:
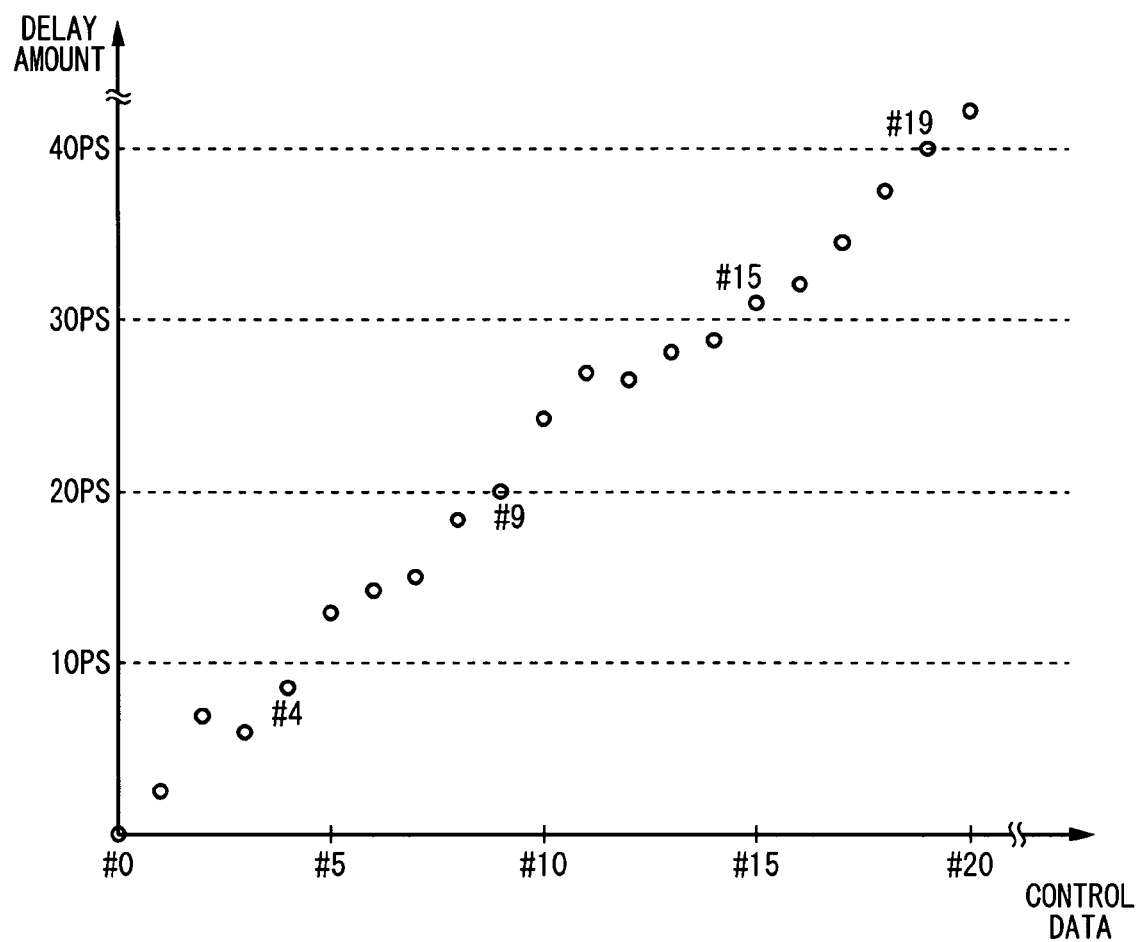
FIG. 3 is a view exemplary showing relationship between control data supplied to a variable delay circuit and a real delay amount in the variable delay circuit.

FIG. 3 is a view exemplary showing relationship between the control data supplied to the variable delay circuit 34 and a real delay amount in the variable delay circuit 34. The variable delay circuit 34 has, e.g., a plurality of delay elements, and is a circuit for changing a delay amount by controlling which one or some of the plurality of delay elements the input signal is passed to according to the given control data. When what kind of control data is supplied, it is measured whether the variable delay circuit 34 causes a delay according to each delay setting value and the linearized memory 32 stores each delay setting values and the control data in association with each other. In this way, the variable delay circuit 34 can cause a delay according to the delay setting value. Since control data best suited for each delay setting value is selected among a plurality of control data, the resolution of the given delay setting value becomes larger than that of the delay capable of being really caused by the variable delay circuit 34.

When the control data are stored on the linearized memory 32, all control data are sequentially supplied to the variable delay circuit 34, and the delay amount caused by the variable delay circuit 34 is measured with respect to each control data. Then, there is extracted control data capable of producing the delay best suited for the delay setting value, e.g., given every 10 ps. In this example, the control data #0, #4, #9, #15, #19, and so on are respectively extracted with respect to the delay setting values 0 ps, 10 ps, 20 ps, 30 ps, 40 ps, and so on. The linearized memory 32 stores these delay setting values and the control data in association with each other.

FIG. 4 is a view exemplary showing data stored on the linearized memory 32. As described above, the linearized memory 32 stores the delay setting values and the control data in association with each other. In this example, each address of the linearized memory 32 corresponds to each delay setting value. The skew adjusting unit 46 adjusts the measured skew by adjusting the control data stored on the linearized memory 32.

For example, the skew adjusting unit 46 detects which of the phases of the signals output from the first variable delay circuit 36-1 and the second variable delay circuit 36-2 is early, and stores the control data to be stored in association with a setting value, which is obtained by adding a value according to the measured skew to the each delay setting value, on the first linearized memory 32-1 or the second linearized memory 32-2 corresponding to the first variable delay circuit 36-1 or the second variable delay circuit 36-2 that outputs the signal having the early phase, in association with the each delay setting value.

In this example, when the phase of the signal output from the second variable delay circuit 36-2 is early, the adjustment of the control data stored on the second linearized memory 32-2 will be described.

Figure 5:
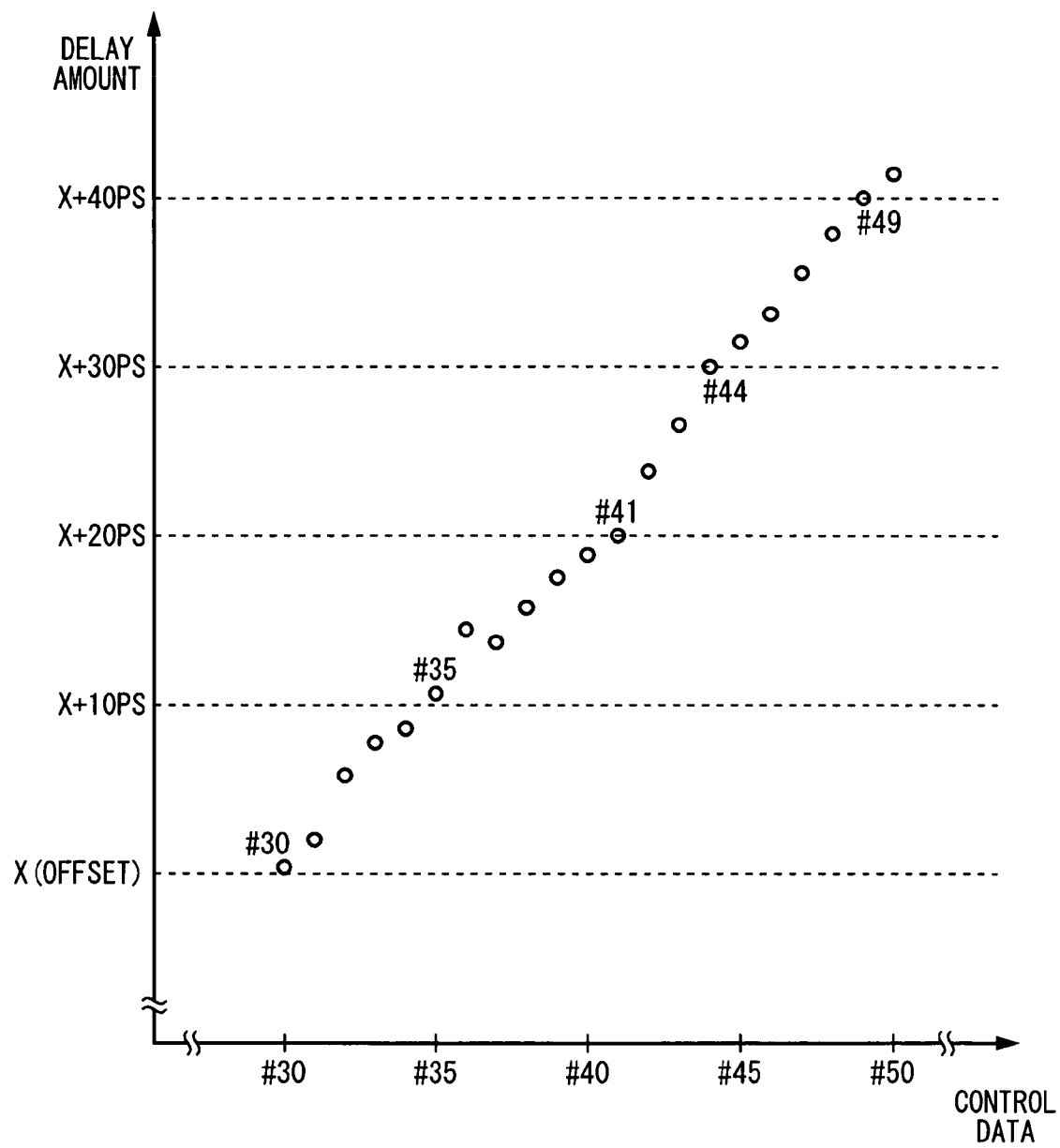
FIG. 5 is a view exemplary showing relationship between control data supplied to a second variable delay circuit and a real delay amount in the second variable delay circuit.

FIG. 5 is a view exemplary showing relationship between the control data supplied to the second variable delay circuit 36-2 and the real delay amount in the second variable delay circuit 36-2. At first, the skew adjusting unit 46 measures a skew between the first set signal and the second set signal when the delay setting values in the first variable delay circuit 36-1 and the second variable delay circuit 36-2 are respectively set to the smallest delay setting value.

Then, in case of the first variable delay circuit 36-1 in which the phase of the output signal is late, the skew adjusting unit 46 stores the control data on the corresponding first linearized memory 32-1 in the method described using FIGS. 3 and 4.

Next, the skew adjusting unit 46 also supplies all control data to the second variable delay circuit 36-2 sequentially, and measures a real delay amount for each control data. Then, there is extracted the control data to be stored in association with the setting value that is obtained by adding an offset value X according to the measured skew to each given delay setting value. In this example, the control data #30, #35, #41, #44, #49, and so no are respectively extracted with respect to the delay setting values 0 ps, 10 ps, 20 ps, 30 ps, 40 ps, and so on.

Then, the skew adjusting unit 46 respectively stores the extracted control data on the second linearized memory 32-2 in association with the delay setting values to which the offset value X is not added.

FIG. 6 is a view exemplary showing data stored on the second linearized memory 32-2. As described above, the second linearized memory 32-2 stores the delay setting value and the control data according to the skew in association with each other. By such an operation, the skew between the first set signal and the second set signal can be adjusted. Moreover, as described above, the resolution of the delay setting value is larger than that of the delay amount really generated from the variable delay circuit 34. However, since the delay amount adjusting a skew is selected out of the delay amounts really generated from the variable delay circuit 34, the timing generator 20 of this example can reduce the skew up to real delay resolution of the variable delay circuit 34.

Moreover, the timing generator 20 includes skew registers 28-1 and 28-2 (see FIG. 2) that store a quotient obtained by dividing the skew measured by the skew adjusting unit 46 by the resolution of the delay setting values of the first variable delay circuit 36-1 and the second variable delay circuit 36-2, and addition units 30-1 and 30-2 (see FIG. 2) that add the value stored on the skew registers 28-1 and 28-2 to the delay setting value to be supplied to one that outputs the signal having the early phase out of the first variable delay circuit 36-1 or the second variable delay circuit 36-2.

In this case, the skew adjusting unit 46 stores the control data to be stored in association with a setting value, which is obtained by adding a remainder obtained by dividing the measured skew by the resolution of the delay setting values of the first variable delay circuit 36-1 and the second variable delay circuit 36-2 to the each delay setting value, on the first linearized memory 32-1 or the second linearized memory 32-2 corresponding to the first variable delay circuit 36-1 or the second variable delay circuit 36-2 that outputs the signal having the early phase, in association with the each delay setting value. According to such a configuration, a skew more than the resolution of the delay setting value can easily be removed by controlling the delay setting value to be supplied to the variable delay circuit 34 and a skew smaller than the resolution of the delay setting value can be reduced in the method described above.

Moreover, the skew adjusting unit 46 measures a loop period of each signal by counting a leading edge or a trailing edge of the first set signal or the second set signal that passes the loop path 60 for a predetermined period. As shown in FIG. 2, a plurality of pulsers 48, 52, 54, 56, and 58 for adjusting a pulse width is provided in the loop path 60. In this case, a skew between the first set signal and the second set signal may be changed according to which of a leading edge and a trailing edge of each set signal is used as a standard.

The use of the timing signal generated from the timing generator 20 determines which edge is used as a standard in order to measure a skew between the first set signal and the second set signal. As shown in FIG. 2, when inputting the set signal to the set/reset latch 22, since the set/reset latch 22 generally operates according to the leading edge of the signal, it is necessary to measure a skew using the leading edge of the set signal as a standard. Moreover, when the judgment section 14 uses such an edge as a strobe signal detecting a value of an output signal, since a comparator generally operates according to a trailing edge of the signal, it is necessary to measure a skew using the trailing edge of the set signal as a standard.

The loop path 60 has an exclusive OR circuit 50 that outputs an exclusive logical sum of a signal passing the loop path 60 and an edge control signal showing which of a leading edge and a trailing edge of the first set signal and the second set signal is used as a standard in order to measure a skew, and selects either whether there are output the first set signal and the second set signal by noninversion or whether there are output the first set signal and the second set signal by inversion according to the edge control signal. By such a configuration, according to the use of the timing signal, it is possible to control which of the leading edge and the trailing edge of the set signal is used as a standard in order to adjust a skew. The edge control signal may be supplied from, e.g., the pattern generator 10.

Figure 7:
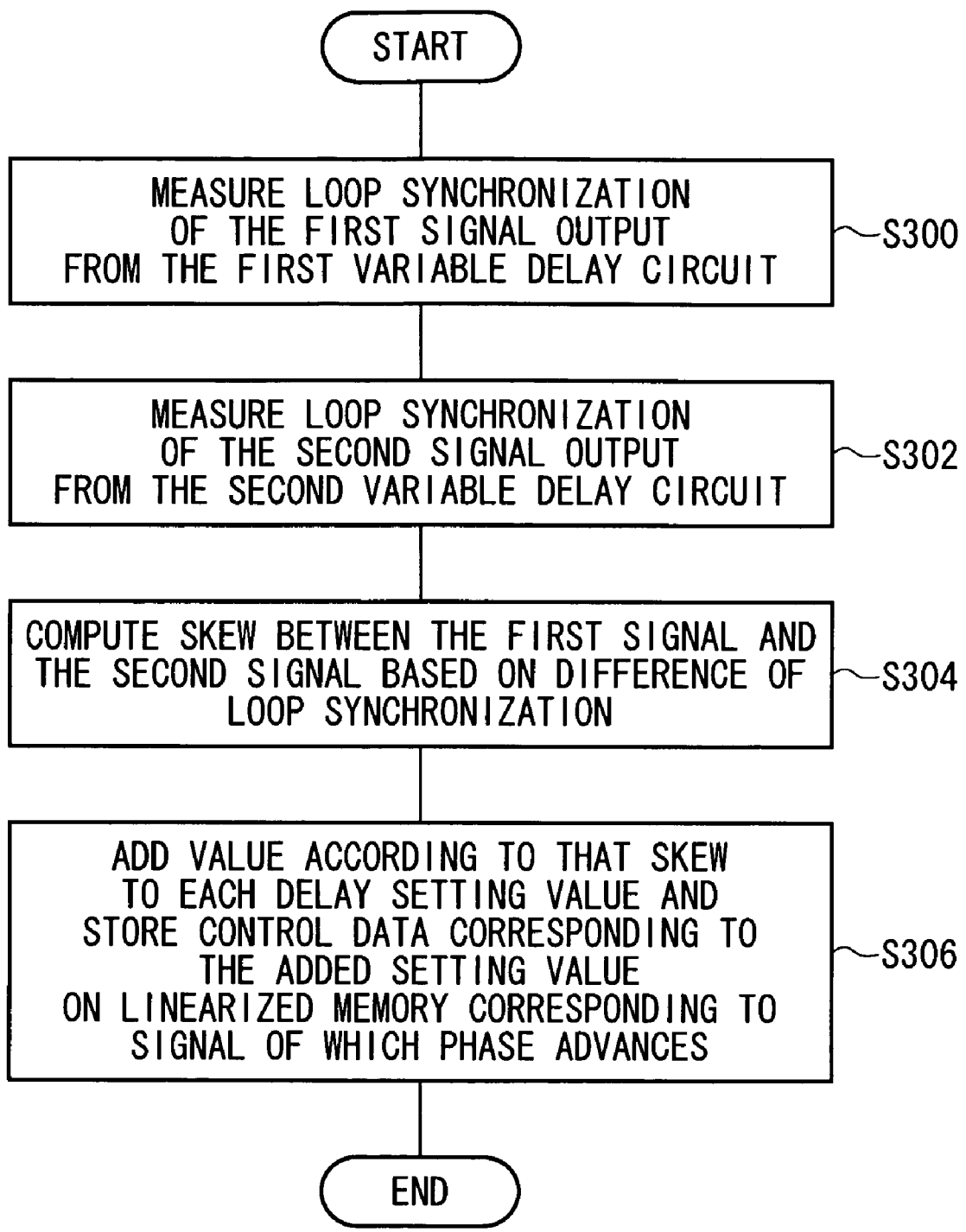
FIG. 7 is a flowchart showing brief summaries of a skew adjusting method adjusting a skew between a first set signal and a second set signal in the timing generator described using FIG. 2.
Figure 8:
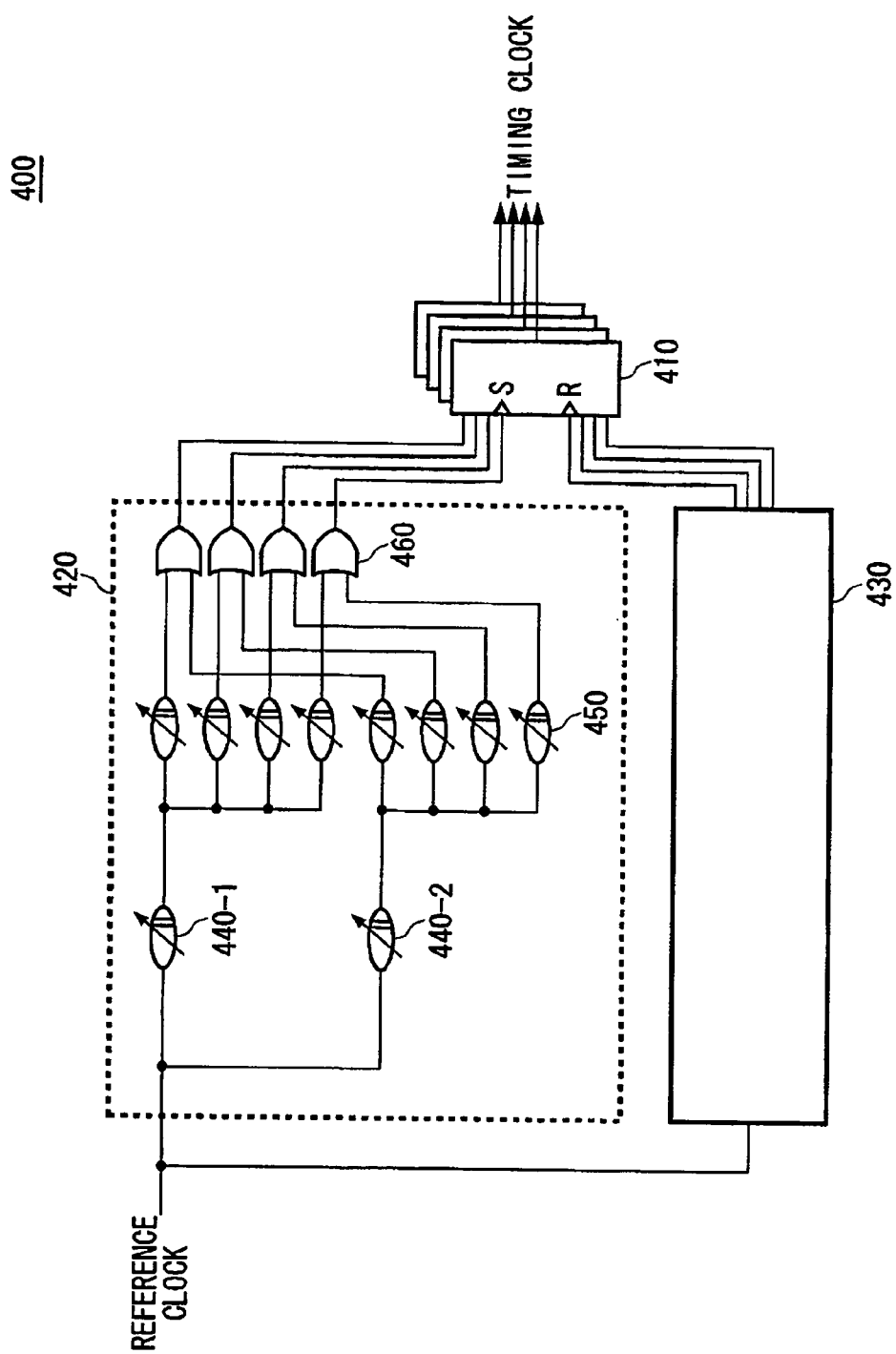
FIG. 8 is a view showing a conventional timing generator.

FIG. 7 is a flowchart showing brief summaries of a skew adjusting method adjusting a skew between the first set signal and the second set signal in the timing generator 20 described using FIG. 2. According to the skew adjustment method, the skew is adjusted in the method explained in FIGS. 2 to 6.

At first, a loop period of the first set signal is measured (the first period computing step S300). Next, a loop period of the second set signal is measured (the second period computing step S302). Then, a skew between the first set signal and the second set signal is computed based on the difference between the loop period computed in the first period computing step S300 and the loop period computed in the second period computing step S302 (the skew measuring step S304).

Then, the value according to the skew is added to each delay setting value, and the control data corresponding to the added setting value is stored on the linearized memory 32 corresponding to the set signal of which phase advances in association with the delay setting value (the skew adjusting step S306). By such a method, a skew can be adjusted with high precision.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As apparent from the above descriptions, according to the present invention, it is possible to provide a timing generator having low power consumption. Moreover, it is possible to adjust a skew between the interleaved signals with high precision in a timing generator that operates in an interleaving method.

What is claimed is:

1. A timing generator generating a timing signal of a predetermined period, comprising:
   a set/reset latch operable to generate a rising edge of the timing signal according to a set signal and generate a trailing edge of the timing signal according to a reset signal;
   a set unit operable to supply the set signal to said set/reset latch, said set unit comprising:
      a first variable delay circuit that delays a given reference clock to output a first set signal;
      a second variable delay circuit that delays the given reference clock to output a second set signal having a phase different from the first set signal;
      an OR circuit that computes a logical sum of the first set signal and the second set signal to generate the set signal; and
      a third variable delay circuit that delays the set signal output from the OR circuit to adjust a skew between the set signal and the reset signal, and
   a reset unit operable to supply the reset signal to said set/reset latch.

2. The timing generator as claimed in claim 1, further comprising a skew adjusting unit operable to measure a skew between the first set signal and the second set signal and control a delay amount in the first variable delay circuit or the second variable delay circuit based on the measured skew.

3. The timing generator as claimed in claim 2, wherein the timing generator further comprises:
   a signal input unit operable to receive the reference clock, stop inputting the reference clock to the second variable delay circuit when measuring the timing in which the first variable delay circuit outputs the first set signal, and stop inputting the reference clock to the first variable delay circuit when measuring the timing in which the second variable delay circuit outputs the second set signal; and
   a loop path operable to input the set signal output from the OR circuit to said signal input unit by feedback as the reference clock, and
   said skew adjusting unit measures a skew between the first set signal and the second set signal based on a difference between a loop period for which the set signal passes said loop path when measuring the timing in which the first variable delay circuit outputs the first set signal and a loop period for which the set signal passes said loop path when measuring the timing in which the second variable delay circuit outputs the second set signal.

4. The timing generator as claimed in claim 2, wherein the timing generator further comprises:
   a first linearized memory operable to store control data controlling the first variable delay circuit according to a given delay setting value in association with the each delay setting value; and
   a second linearized memory operable to store control data controlling the second variable delay circuit according to a given delay setting value in association with the each delay setting value, and
   said skew adjusting unit adjusts the control data stored on said first linearized memory and said second linearized memory based on the measured skew.

5. The timing generator as claimed in claim 4, wherein said skew adjusting unit measures a skew between the first set signal and the second set signal when setting the delay setting values related to the first variable delay circuit and the second variable delay circuit to a minimum delay setting value, and adjusts the control data stored on said first linearized memory and said second linearized memory based on the measured skew.

6. The timing generator as claimed in claim 5, wherein said skew adjusting unit detects which of the phases of the signals output from the first variable delay circuit and the second variable delay circuit is early, and stores the control data to be stored in association with a setting value, which is obtained by adding a value according to the measured skew to the each delay setting value, on said first linearized memory or said second linearized memory corresponding to the first variable delay circuit or the second variable delay circuit that outputs the signal having the early phase, in association with the each delay setting value.

7. The timing generator as claimed in claim 6, wherein the timing generator further comprises:
   a skew register operable to store a quotient that is obtained by dividing the skew measured by said skew adjusting unit by resolution of the delay setting values of the first variable delay circuit and the second variable delay circuit; and
   an addition unit operable to add the value stored on said skew register to the delay setting value to be supplied to the first variable delay circuit or the second variable delay circuit that supplies the signal having the early phase, and
   said skew adjusting unit stores the control data to be stored in association with a setting value, which is obtained by adding a remainder obtained by dividing the measured skew by resolution of the delay setting values of the first variable delay circuit and the second variable delay circuit to the each delay setting value, on said first linearized memory or said second linearized memory corresponding to the first variable delay circuit or the second variable delay circuit that outputs the signal having the early phase, in association with the each delay setting value.

8. The timing generator as claimed in claim 3, further comprising an exclusive OR circuit provided on said loop path, and operable to select either whether there are output the first set signal and the second set signal by noninversion or whether there are output the first set signal and the second set signal by inversion according to an edge control signal showing which of a leading edge and a trailing edge of the first set signal and the second set signal the skew is measured based on.

9. A skew adjusting method adjusting a skew between a first signal and a second signal in a timing generator that comprises:
   a first variable delay circuit that outputs the first signal;
   a second variable delay circuit that outputs the second signal;
   a first linearized memory that stores control data controlling the first variable delay circuit according to a given delay setting value in association with the each delay setting value;
   a second linearized memory that stores control data controlling the second variable delay circuit according to a given delay setting value in association with the each delay setting value; and
   an OR circuit that outputs a logical sum of the first signal and the second signal, the skew adjusting method comprising:
- a first period computing step of inputting the first signal to the first variable delay circuit via the OR circuit by feedback and computing a period by which the OR circuit outputs the first signal;
- a second period computing step of inputting the second signal to the second variable delay circuit via the OR circuit by feedback and computing a period by which the OR circuit outputs the second signal;
- a skew measuring step of computing a skew between the first signal and the second signal based on the difference between the period computed in said first period computing step and the period computed in said second period computing step; and
- a skew adjusting step of storing the control data to be stored in association with a setting value, which is obtained by adding a value according to the skew measured in said skew measuring step to the each delay setting value, on either the first linearized memory or the second linearized memory, in association with that delay setting value.

* * * * *